(12) United States Patent
Awakura et al.

(10) Patent No.: US 6,919,772 B2
(45) Date of Patent: Jul. 19, 2005

(54) WIRING BOARD COMPRISING GRANULAR MAGNETIC FILM

(75) Inventors: Yoshio Awakura, Yokohama (JP); Shinya Watanabe, Tokyo (JP); Satoshi Shiratori, Tokyo (JP); Hiroshi Ono, Yokohama (JP)

(73) Assignee: NEC TOKIN Corporation, Miyagi (JP)

( * ) Notice: Subject to any disclaimer, the term of this patent is extended or adjusted under 35 U.S.C. 154(b) by 0 days.

(21) Appl. No.: 10/655,823

(22) Filed: Sep. 5, 2003

(65) Prior Publication Data

US 2004/0124941 A1 Jul. 1, 2004

Related U.S. Application Data

(62) Division of application No. 09/825,418, filed on Apr. 3, 2001, now Pat. No. 6,653,573.

(30) Foreign Application Priority Data

Apr. 4, 2000 (JP) ........................................ 2000-101756
Apr. 4, 2000 (JP) ........................................ 2000-101765

(51) Int. Cl.[7] .............................. H01P 1/23; H05K 9/00
(52) U.S. Cl. ........................... 333/12; 361/795; 361/818
(58) Field of Search ........................... 333/12, 181, 184, 333/185; 361/793, 794, 795, 818

(56) References Cited

U.S. PATENT DOCUMENTS

| | | | |
|---|---|---|---|
| 5,435,903 A | 7/1995 | Oda | |
| 5,493,074 A | 2/1996 | Murada et al. | |
| 5,639,989 A | 6/1997 | Higgins, III | |
| 5,698,131 A | * 12/1997 | Saitou et al. | ............ 252/62.57 |
| 5,738,931 A | 4/1998 | Sato et al. | |
| 5,966,294 A | 10/1999 | Harada et al. | |
| 5,998,048 A | 12/1999 | Jin et al. | |
| 6,021,050 A | * 2/2000 | Ehman et al. | ............... 361/793 |
| 6,208,000 B1 | 3/2001 | Tanamoto et al. | |
| 6,462,630 B1 | * 10/2002 | Ikeda et al. | ................. 333/181 |

FOREIGN PATENT DOCUMENTS

| | | |
|---|---|---|
| FR | 7331249 | 3/1974 |
| JP | 01151297 | 6/1989 |
| JP | 401235662 | 9/1989 |
| JP | 04196285 | 11/1990 |
| JP | 03120890 | 5/1991 |
| JP | 05183291 | 7/1993 |
| JP | 06275927 | 3/1994 |
| JP | 07058485 | 3/1995 |
| JP | 08250858 | 9/1996 |
| JP | 11233909 | 2/1998 |
| JP | 11274362 | 3/1998 |

OTHER PUBLICATIONS

European Search Report, Jan. 11, 2002, European Patent Office.

* cited by examiner

*Primary Examiner*—Dean Takaoka
(74) *Attorney, Agent, or Firm*—Bradley N. Ruben (57) ABSTRACT

In order to provide a wiring board comprising a magnetic material effective in suppressing spurious radiation in semiconductor devices and electronic circuits and the like that operate at high speeds, a wiring board (15) comprises an insulative base material (17), conductor patterns (19a to 19f) formed thereon, and magnetic thin films (21a to 21f) formed on the conductor patterns (19a to 19f). The magnetic thin film is configured of a magnetic loss material represented by M-X-Y, where M is at least one of Fe, Co, and Ni, X is at least one element other than M or Y, and Y is at least one of F, N, and O, the maximum value $\mu''$max of the loss factor $\mu''$ that is an imaginary component in the complex permeability characteristic of the magnetic loss material exists within a frequency range of 100 MHz to 10 GHz, and a relative bandwidth bwr is not greater than 200% or not smaller than 150% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof.

19 Claims, 10 Drawing Sheets

WIRING BOARD COMPRISING GRANULAR MAGNETIC FILM

This application is a divisional of application Ser. No. 09/825,418, filed 3 Apr. 2001 now U.S. Pat. No. 6,653,573, a Convention application based on Japanese applications 101756 and 101765, both filed 4 Apr. 2000.

BACKGROUND OF THE INVENTION

1. Field of the Invention

This invention relates to wiring boards that comprise magnetic bodies that exhibit outstanding magnetic loss characteristics at high frequencies, and more particularly to wiring boards such as flexible wiring boards and flexible flat cables that comprise multilayer or unilayer wiring boards or high-frequency current suppression bodies wherein magnetic loss materials are used that exhibit outstanding complex permeability characteristics and are effective in suppressing electromagnetic interference and spurious radiation that are problematic in active devices that operate at high speed, high-frequency electronic components, and electronic equipment mounted thereon.

2. Description of the Related Art

In recent years, the proliferation of highly integrated semiconductor devices has been remarkable which operate at high speed. Examples include the random access memory (RAM), read only memory (ROM), microprocessor (MPU), central processing unit (CPU), image processing arithmetic logic unit (IPALU), and other logic circuit devices. In these active devices, higher speeds are being achieved at a prodigious rate in terms of calculating speed and signal processing speed, and the electrical signals propagated through the high-speed electronic circuits have become a major cause of inductive and high-frequency noise because of the rapid voltage and current changes associated therewith. Meanwhile, the trend toward lighter weight, thinner profile, and smaller size in electronic components and electronic equipment continues rapidly and unabatedly. In conjunction with that trend, the integration levels being achieved in semiconductor devices and the higher electronic component mounting densities being realized in printed wiring or circuit boards are also remarkable. Accordingly, electronic devices and signal lines that are integrated or mounted overly densely become extremely close to each other, and the situation is now such that, in conjunction with the higher signal processing speeds being achieved, as remarked earlier, high-frequency spurious radiation noise is easily induced.

Problems have been pointed out with spurious radiation from power supply lines going to active devices in such recent electronic integrated devices and wiring boards, against which such measures as the insertion of decoupling condensers or other concentrated constant components into the power lines have been implemented.

However, because the noise generated in higher speed implementations of electronic integrated devices and wiring boards contains harmonic components, signal paths exhibit a distributed constant behavior, and situations have arisen where measures against noise that presume conventional concentrated constant circuits are ineffective.

Similar problems have arisen also, inside electronic equipment, relating to connections between boards, and to the flexible wiring or printed circuit boards (FPCs) or flexible flat cables (FFCs) (hereinafter both referred to by the generic term flexible wiring or printed circuit board (FPC)) mounted to electronic components.

SUMMARY OF THE INVENTION

It is one object of the present invention to provide flexible wiring boards that comprise magnetic material effective in countering spurious radiation from semiconductor devices and electronic circuits that operate at high speeds, as described above.

It is another object of the present invention is to provide flexible wiring boards that comprise magnetic loss materials exhibiting a large magnetic loss factor $\mu''$ wherewith effective measures against spurious radiation can be implemented with a magnetic body of smaller volume.

According to one aspect of the present invention, there is provided a wiring board which comprises an insulative base material, conductor patterns formed thereon, and magnetic thin films formed on the conductor pattern.

In the aspect of the present invention, it is preferable that the magnetic thin film is configured of a magnetic loss material having a composition represented by M-X-Y, where M is at least one of Fe, Co, and Ni, X is at least one element other than M or Y, and Y is at least one of F, N, and O, that the magnetic loss material is a narrow-band magnetic loss material in which a maximum value $\mu''\text{max}$ of loss factor $\mu''$ that is imaginary component in complex permeability characteristic of the magnetic loss material exists within a frequency range of 100 MHz to 10 GHz, and that a relative bandwidth bwr is not greater than 200% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof.

In the aspect of the present invention, it is also preferable that the magnetic thin film is configured of a magnetic loss material having a composition represented by M-X-Y, where M is at least one of Fe, Co, and Ni, X is at least one element other than M or Y, and Y is at least one of F, N, and O, that the magnetic loss material is a broad-band magnetic loss material in which maximum value $\mu''\text{max}$ of loss factor $\mu''$ that is imaginary component in complex permeability characteristic of the magnetic loss material exists within a frequency range of 100 MHz to 10 GHz, and that a relative bandwidth bwr is not smaller than 150% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof.

According to another aspect of the present invention, there is provided a wiring board which comprises a board of at least one layer comprising a conductor part, and magnetic thin films deployed at least on part of the board or the conductor part.

In the aspect of the present invention, it is also preferable that the magnetic thin film is configured of a magnetic loss material having a composition represented by M-X-Y, where M is at least one of Fe, Co, and Ni, Y is at least one of F, N, and O, and X is at least one element other than M or Y, the magnetic loss material is a narrow-band magnetic loss material in which maximum value $\mu''\text{max}$ of loss factor $\mu''$ that is imaginary component in complex permeability of the magnetic loss material exists within a frequency range of 100 MHz to 10 GHz, and that a relative bandwidth bwr is not greater than 200% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof.

DESCRIPTION OF THE PREFERRED EMBODIMENTS

The history of the present invention will be specifically described prior to describing embodiments of the present invention.

The inventors, having previously invented a composite magnetic body exhibiting large magnetic loss at high frequencies, discovered a method wherewith, by deploying that composite magnetic body in the vicinity of a spurious radiation source, the generation of spurious radiation from the semiconductor devices and electronic circuits noted earlier, etc., is effectively suppressed. It is known from recent research on the active mechanism of spurious radiation attenuation using such magnetic loss is based on the impartation of equivalent resistance components to the electronic circuits constituting sources of spurious radiation. Here, the size of the equivalent resistance component is dependent on the size of the magnetic loss factor $\mu''$ of the magnetic body. More specifically, the size of the resistance component that is equivalently inserted in an electronic circuit is roughly proportional to $\mu''$ and the thickness of the magnetic body when the area of the magnetic body is constant. Accordingly, a larger $\mu''$ becomes necessary in order to obtain a desired spurious radiation attenuation with a smaller or thinner magnetic body.

For example, in order to effect measures against spurious radiation using a magnetic loss body in a miniscule region such as in the interior of a semiconductor device mold, an extremely large value for the magnetic loss factor $\mu''$ becomes necessary, whereupon magnetic bodies having significantly larger $\mu''$ than conventional magnetic loss materials have been sought.

The inventors, in the course of their research on soft magnetic materials using a sputtering or vapor deposition method, took note of the outstanding permeability of granular magnetic bodies wherein very fine magnetic metal particles are diffused uniformly in a non-magnetic body such as a ceramic, and conducted research on the microstructures of magnetic metal particles and the non-magnetic bodies surrounding them. As a result, the inventors discovered that outstanding magnetic loss characteristics are obtained in high-frequency regions when the concentration of magnetic metal particles in a granular magnetic body is within a certain range.

Now, much research has been done to date on granular magnetic bodies having M-X-Y compositions (where M is a magnetic metal element, Y is either O, N, or F, and X is an element other than M or Y), and it is known that these are low-loss and exhibit large saturation magnetization. In these M-X-Y granular magnetic bodies, the size of the saturation magnetization is dependent on the volume ratio accounted for by the M component. Therefore, the ratio of the M component must be made high to obtain large saturation magnetization. For that reason, the ratio of the M component in an M-X-Y granular magnetic body for an ordinary application such as use as a magnet core in a high-frequency inductor device or transformer or the like has been limited to a range wherewith a saturation magnetization of roughly 80% or greater can be realized for the saturation magnetization of the bulk metal magnetic body consisting exclusively of the M component.

The inventors studied the ratio of the M component in granular magnetic bodies having the M-X-Y composition (where M is a magnetic metal element, Y is either O, N, or F, and X is an element other than M or Y) across a wide range, and discovered, as a result, that, with every composition system, large magnetic loss is exhibited in high-frequency regions when the magnetic metal M is present within a specific concentration range.

Furthermore, the highest region where the M component exhibits a saturation magnetization of 80% or greater relative to the saturation magnetization of a bulk metal magnetic body consisting exclusively of the M component is the M-X-Y granular magnetic body region of low loss at high saturation magnetization that has been widely researched for some time. Materials in this region are used in high-frequency micromagnetic devices such as the high-frequency inductors mentioned above because the values of the real-part permeability ($\mu'$) and the saturation magnetization are both large, but the ratio accounted for by the X-Y component that affects electrical resistance is small, wherefore electrical resistivity is also small. For that reason, when the film thickness becomes thin, the permeability at high frequencies deteriorates in conjunction with the development of eddy current loss in the high-frequency region, wherefore these materials are unsuitable for use in comparatively thick magnetic films such as are used to suppress noise. In the region for the M component ratio exhibiting a saturation magnetization of 80% or less but 60% or more of the saturation magnetization of a bulk metal magnetic body consisting of only the M component, the electrical resistivity is comparatively large at roughly 100 $\mu\Omega$·cm or greater.

Therefore, even if the thickness of the material is on the order of several $\mu$m, the loss due to eddy currents is small, and almost all of the magnetic loss will be due to natural resonance. For that reason, the frequency dispersion width for the magnetic loss factor $\mu''$ will become narrow, wherefore such materials are suitable for anti-noise measures in narrow-band frequency ranges. Here, in the region for the M component ratio exhibiting a saturation magnetization that is 60% or less but 35% or greater of the saturation magnetization of a bulk metal magnetic body consisting solely of the M component, the electrical resistivity will be even larger, at roughly 500 $\mu\Omega$·cm or greater, so the loss due to eddy currents will be extremely small, and, because the magnetic interaction between M component becomes small, spin thermal disturbance becomes large, and quivering develops in the frequency where natural resonance occurs. As a consequence, the magnetic loss factor $\mu''$ will come to exhibit a large value across a broad range. Accordingly, this composition region is suitable for wide-band high-frequency current suppression.

In regions where the M component ratio is even smaller than in the region of the present invention, on the other hand, super-normal magnetism will occur because the magnetic interaction between M components will hardly appear at all.

When a magnetic loss material is deployed immediately adjacent to an electronic circuit and high-frequency current is to be suppressed, the material design standard is given by the product of the magnetic loss factor $\mu''$ and the thickness $\delta$ of the magnetic loss material, that is, $\mu''\cdot\delta$, and, in order to effectively suppress the high-frequency current at a frequency of several hundreds of MHz, the rough requirement will be $\mu''\cdot\delta \geq 1000$ ($\mu$m).

Accordingly, with a magnetic loss material exhibiting $\mu''=1000$, a thickness of 1 $\mu$m or greater becomes necessary, whereupon a material of low electrical resistance susceptible to eddy current loss is not suitable, but what is suitable is a composition wherewith the electrical resistivity becomes 100 $\mu\Omega$cm or greater, that is, in the composition system of the present invention, wherein the M component ratio is in a region where a saturation magnetization is exhibited that is 80% or lower than the saturation magnetization of a bulk metal magnetic body consisting solely of the M component and super-normal magnetism is not manifest, that is, a region exhibiting a saturation magnetization that is 35% or greater relative to the saturation magnetization of the bulk metal magnetic body consisting solely of the M component.

The inventors arrived at the present invention by applying such a magnetic material to flexible wiring or printed circuit boards.

Embodiments of the present invention are now described with reference to the drawings.

Figure 1:
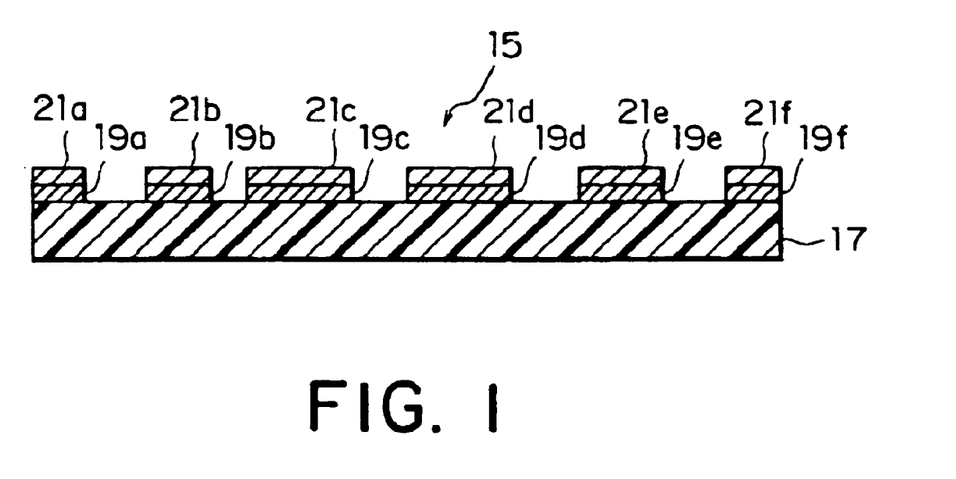
FIG. 1 is a section of a flexible wiring board according to a first embodiment of the present invention.

Referring to FIG. 1, a flexible wiring or printed circuit board 15, which will be referred to hereinafter as flexible wiring board, has a flexible base material 17 consisting of a polyimide or the like, and conductor patterns 19a, 19b, 19c, 19d, 19e and 19f formed on one surface of the base material 17. Granular magnetic thin films 21a, 21b, 21c, 21d, 21e, and 21 f are formed on the upper surfaces of the conductor patterns 19a, 19b, 19c, 19d, 19e and 19f so as to coincide with each of those conductor patterns 19a, 19b, 19c, 19d, 19e, and 19f.

Figure 2A:
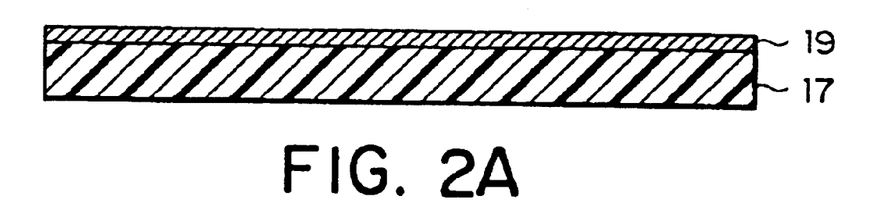
FIGS. 2A to 2E are sections representing, in order, procedures for fabricating the flexible wiring board diagrammed in FIG. 1.

Referring to FIG. 2A, a copper foil 19 is formed by rolling and is applied across one entire surface of the flexible base material 17. Another conductive metal foil may be used instead of this copper foil 19, or it may be a foil made by non-electrolytic plating and electroplating on top thereof.

Figure 2B:
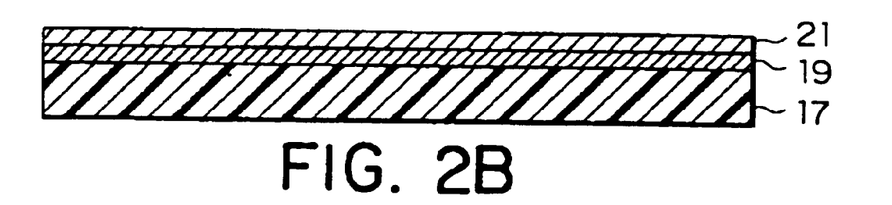

Referring to FIG. 2B, a granular magnetic thin film 21 is formed by vapor deposition so as to cover the entire surface of the copper foil 19.

Figure 2C:
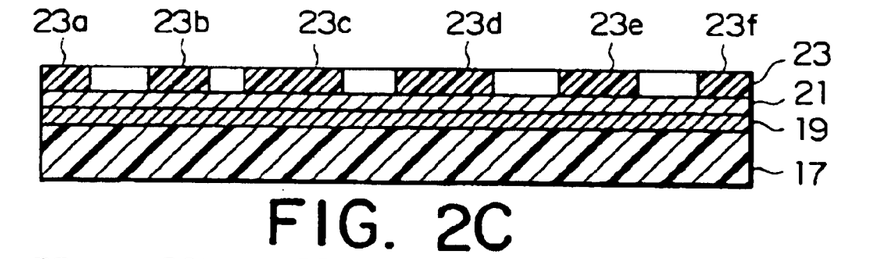

Next, as diagrammed in FIG. 2C, a resist material comprising a UV-hardening resin is applied on that granular magnetic thin film 21, photo-exposed to the desired pattern. The portions other than those exposed are removed with a solvent. As necessary, a heat treatment may also be performed, and the resist patterns 23a, 23b, 23c, 23d, 23e, and 23f hardened.

Figure 2D:
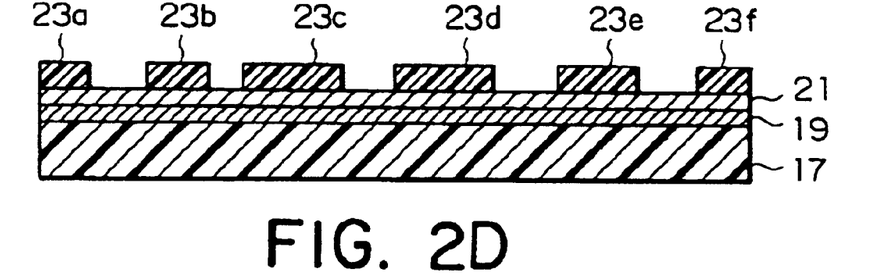

As diagrammed in FIG. 2D, the granular magnetic thin film 21 and copper foil 19 corresponding to the portions where the resist patterns 23a, 23b, 23c, 23d, 23e, and 23f are not formed on the upper surface are simultaneously removed, either by soaking the board whereon the resist has been deployed in a solution of iron chloride (III) or ferric chloride used in ordinary copper etching or similarly by spraying a solution of iron chloride (III) used in ordinary copper etching on from the side where the resist patterns 23a, 23b, 23c, 23d, 23e, and 23f are present.

Figure 2E:
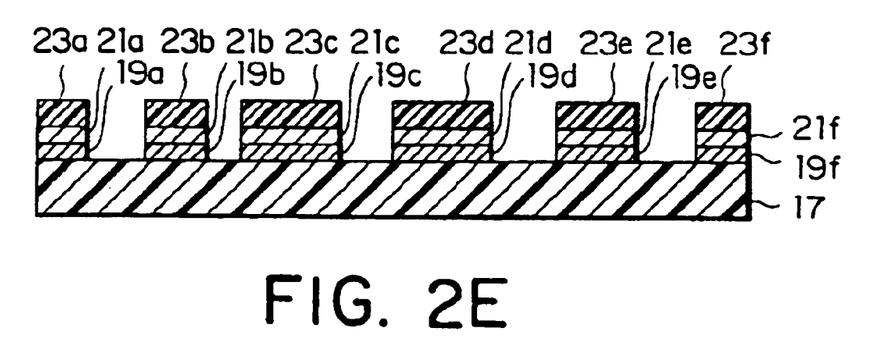

Conductor patterns 19a, 19b, 19c, 19d, 19e, and 19f are formed each of which is covered by the granular magnetic thin films 21a, 21b, 21c, 21d, 21e, and 21f diagrammed in FIG. 2E. In this condition, furthermore, when the resists 23a, 23b, 23c, 23d, 23e, and 23f are removed, a flexible wiring board 15 such as diagrammed in FIG. 1 is completed.

Figure 3:
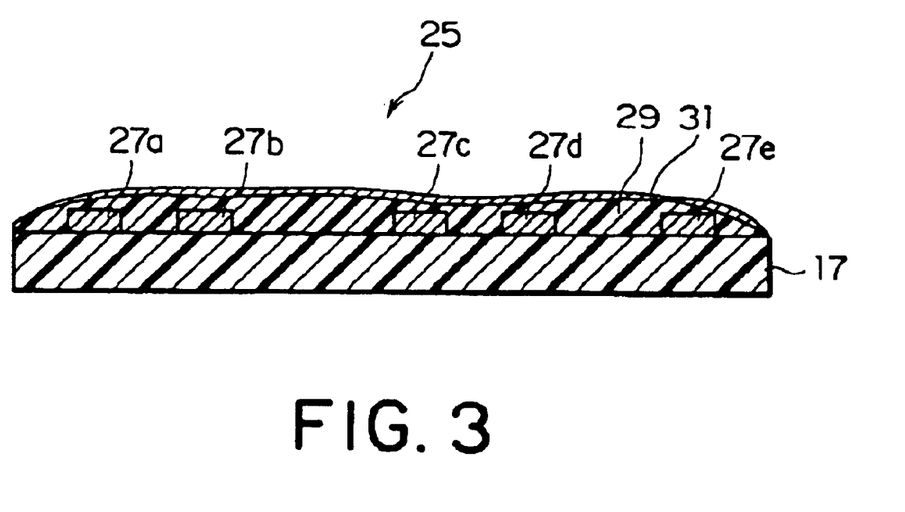
FIG. 3 is a section of a multilayer printed wiring board according to a second embodiment of the present invention.

Referring to FIG. 3, a flexible wiring board 25 according to a second embodiment of the present invention is like a conventional flexible wiring board in that conductor patterns 27a, 27b, 27c, 27d, and 27e of copper or other conductive metal are deployed on the flexible base material 17 of a polyimide or the like.

However, in the flexible wiring board 25 according to the second embodiment of the present invention, an insulation layer 25 is deployed which consists of a synthetic resin or the like so as to cover the entire surface on the side where the conductor patterns 27a, 27b, 27c, 27d, and 27e are deployed, inclusive of the conductor patterns 27a, 27b, 27c, 27d, and 27e, and on the surface of that insulation layer 25 is formed a granular magnetic thin film 31, by vapor deposition or the like, across the entirety thereof. If necessary, moreover, such can be formed in one part only.

In the flexible wiring boards 15 and 25 according to the first and second embodiments having such configurations as these, the granular magnetic thin film 1 absorbs electromagnetic waves that are spuriously emitted from the conductor patterns and converts them to heat, so that the emission of high-frequency noise from these flexible wiring boards 15 and 25 to the outside can be suppressed.

A resin or the like other than a polyimide can be used for the base material of the wiring board so long as it is a synthetic resin exhibiting insulating properties and flexibility.

Figure 4:
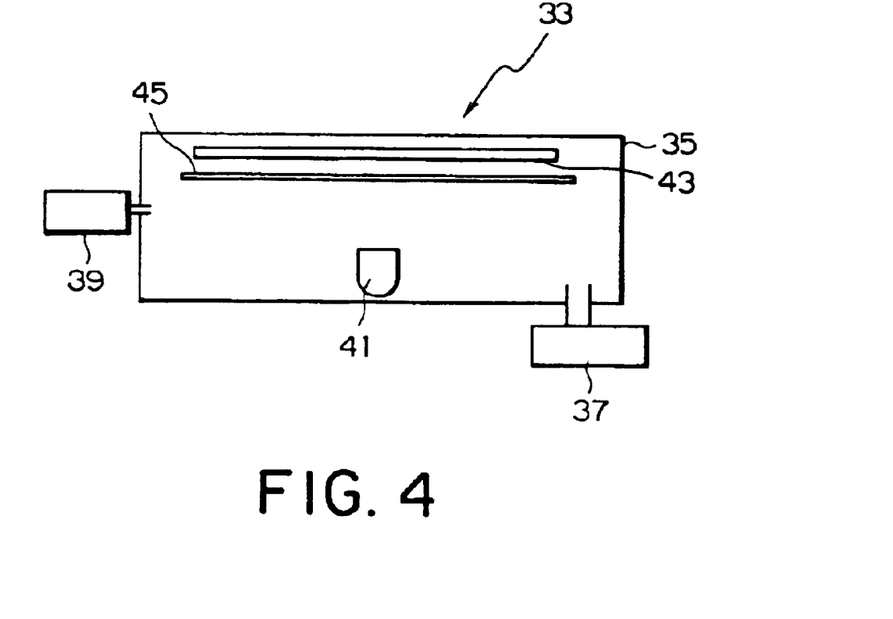
FIG. 4 is a diagram of a simplified apparatus configuration for forming a granular magnetic thin film.

Next, with reference to FIG. 4, a specific example of a manufacturing method for the granular magnetic thin film (magnetic body M-X-Y) according to the embodiments of the present invention is described.

Referring to FIG. 4, a granular magnetic thin film manufacturing apparatus 33 comprises a vacuum chamber 35. The vacuum chamber 35 comprises a vacuum pump 37 for exhausting the air, and a gas supply unit 39. Inside the vacuum chamber 35 are comprised a crucible 41 and, above that crucible 41, aboard 43. A shutter 45 is deployed between the board 43 and the crucible 41.

Next, an example of manufacturing a granular magnetic thin film using the granular magnetic thin film vapor-deposition apparatus diagrammed in FIG. 4 is described.

(Sample 1)

A granular magnetic thin film was fabricated on a base material consisting of a glass board 43, by vapor deposition, under the conditions noted in Table 1 below, using the granular magnetic thin film vapor deposition apparatus 33 diagrammed in FIG. 4, and a heat treatment was performed at 300° C. for 2 hours in a vacuum magnetic field to yield sample 1.

When sample 1 so obtained was subjected to fluoroscopic x-ray analysis, the composition of the film was found to be $Fe_{72}Al_{11}O_{17}$.

The film thickness in sample 1 was 2.0 μm, DC resistivity was 530 μΩ·cm, the anisotropic magnetic field was Hk was 180 e (1422 A/m), Ms was 16800 Gauss (1.68 T), and the relative bandwidth bwr was 148%. The relative bandwidth bwr is obtained by extracting a frequency bandwidth between two frequencies at which the value of $\mu''$ is 50% of the maximum $\mu''_{max}$ and normalizing the frequency bandwidth at the center frequency thereof. The value of the ratio between the saturation magnetization of sample 1 and the saturation magnetization of a metal magnetic body consisting solely of the M component was 72.2%.

TABLE 1

| Vacuum Degree before Deposition | $<1 \times 10^{-6}$ Torr ($=1.33 \times 10^{-4}$ Pa) |
|---|---|
| Oxygen Flow Rate upon Deposition | 3.0 sccm |
| Material | $Fe_{70}Al_{30}$ alloy |

In order to verify the magnetic loss characteristics of the obtained sample 1, the $\mu$-f characteristic was investigated. Measuring the $\mu$-f characteristic is done by inserting the sample into a detection coil fashioned in a rectangular shape, and measuring the impedance while applying a bias magnetic field. Thus the frequency characteristics of the magnetic loss factor $\mu''$ are obtained.

(Comparative Sample 1)

Comparative sample 1 was obtained by the same method and under the same conditions as sample 1 except in that the number of $Al_2O_3$ chips was made 90.

When the comparative sample 1 so obtained was subjected to fluoroscopic x-ray analysis, the composition of the film was found to be $Fe_{86}Al_6O_8$. The film thickness in comparative sample 1 was 1.2 μm, the DC resistivity was 74 μΩ·cm, the anisotropic magnetic field was 22 Oe (1738 A/m), and Ms was 18800 Gauss (1.88 T). The ratio between the saturation magnetization of comparative sample 1 and the saturation magnetization of a metal magnetic body consisting solely of the M component, that is, the value of $\{Ms(M-X-Y)/Ms(M)\} \times 100$, was 85.7%.

Figure 5:
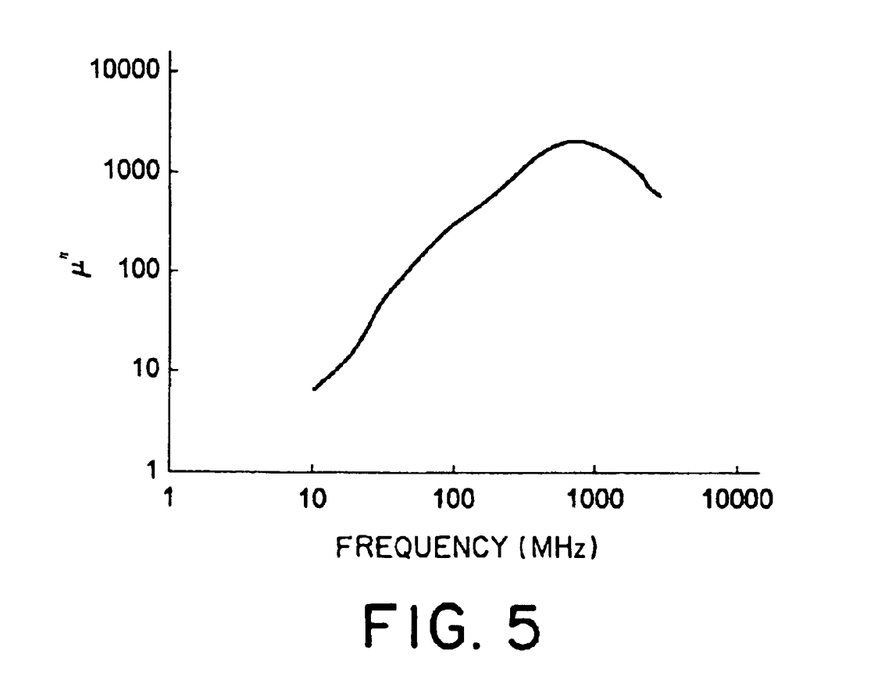
FIG. 5 is a graph representing an example of the frequency dependency of $\mu''$ in a sample 1 according to an embodiment of the present invention.

The $\mu''$-f characteristic of sample 1 of the present invention is plotted in FIG. 5. Referring to FIG. 5, we see that the peak is very large, and that the dispersion is sharp, with the resonant frequency high in the neighborhood of 700 MHz.

When the $\mu''$-f characteristic of comparative sample 1 was investigated, for comparison, it was found that a large $\mu''$ was exhibited, reflecting the fact of the saturation magnetization Ms being large, but also that an eddy current loss was generated together with a rise in frequency due to the low resistance value of the sample, that, for that reason, a deterioration in the permeability or magnetic loss characteristic occurs from the low-frequency region, and that the permeability characteristics have become poor at high frequency.

It will be seen from these results that the magnetic body in sample 1 of the present invention exhibits very large magnetic loss characteristics in the high-frequency region.

In the first and second embodiments of the present invention described in the foregoing, moreover, an FPC board was used, but the present invention can also be applied besides to flexible flat cables (FFCs) having a similar configuration.

Figure 6:
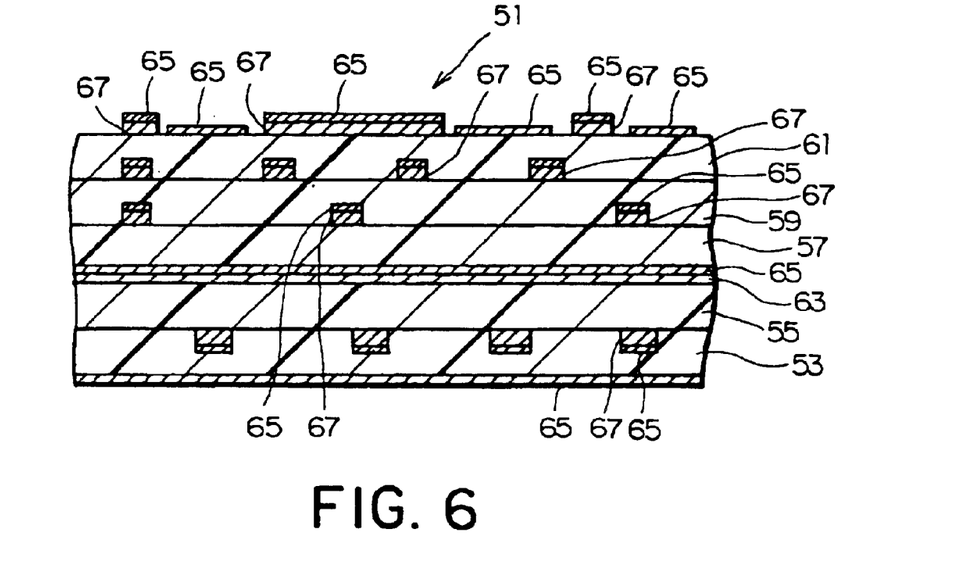
FIG. 6 is a section of a multilayer printed wiring board according to a third embodiment of the present invention.

Referring to FIG. 6, a multi-layer printed wiring or interconnection board 51, which will be hereinafter referred to as multiplayer printed wiring board, according to a third embodiment of the present invention has a laminar structure wherein a first to a fifth printed wiring board 53, 55, 57, 59, and 61 are stacked up. A granular magnetic thin film 65 is formed across the entire surface of a ground pattern 63 deployed on one surface of the first printed wiring board 55 that consists of a glass epoxy material. A conductor pattern 67, on the other hand, is formed on the surface that is on the opposite side from the ground pattern 63 on the printed wiring board. On that conductor pattern 67, further, are formed granular magnetic thin films 65. And on those surfaces is formed a second printed wiring board 53 made of a glass epoxy material. This second printed wiring board 53 is essentially an insulating board that has no conductor pattern. The second printed wiring board 53 does not have the conductor pattern 67, but has the granular magnetic thin film 65 formed across the entire outer surface thereof.

Meanwhile, on the one surface side of the first printed wiring board 55, the other surface of the third printed wiring board 57 comprising the conductor pattern 67 on the one surface thereof is stacked. Then, on the conductor pattern 67 of the third printed wiring board 57, the granular magnetic thin films 65 are formed. On this third printed wiring board 57 is formed the fourth printed wiring board 59 consisting of a glass epoxy material. On the surface of the fourth printed wiring board 59 that is on the opposite side from the third printed wiring board 57 are formed the conductor patterns 67, and on top of that are formed the granular magnetic thin films 65.

On the fourth printed wiring board 59 the fifth printed wiring board 61 consisting of a glass epoxy material is formed. On the surface of this fifth printed wiring board 61 that is on the opposite side from the fourth printed wiring board 57, the conductor patterns 67 are formed, and on top of those, the granular magnetic thin films 65 are formed. Further, also on the surface where no conductor patterns 67 are formed, the granular magnetic thin films 65 are formed, at intervals with the conductor patterns 67. The granular magnetic thin films 65 deployed between the conductor patterns can be deployed directly on the insulation board and used as conductors even if not deployed so as to make contact on the conductor patterns 67.

In a multi-layer wiring board according to the third embodiment having such a configuration as this, the granular magnetic thin films 65 absorb the high frequency waves emitted from the conductor patterns 67, and convert them to heat. Therefore, the emission of high-frequency noise from the multi-layer wiring board to the outside can be suppressed.

The multi-layer wiring board according to the third embodiment is configured such that, after applying the first and third printed wiring boards 55 and 57, the second, fourth, and fifth printed wiring boards or insulation layers are formed in order. However, it goes without saying that multiple printed wiring boards having a glass epoxy material as the board may be prepared from the beginning, and those applied using an adhesive such as an epoxy resin or the like.

Polyimides and the like, for example, can also be used for the boards, so long as they are synthetic resins exhibiting insulative properties.

The granular magnetic thin film 1, moreover, can be deployed directly on the insulation board and used as a conductor, even if not deployed on the conductor pattern 2.

Figure 7:
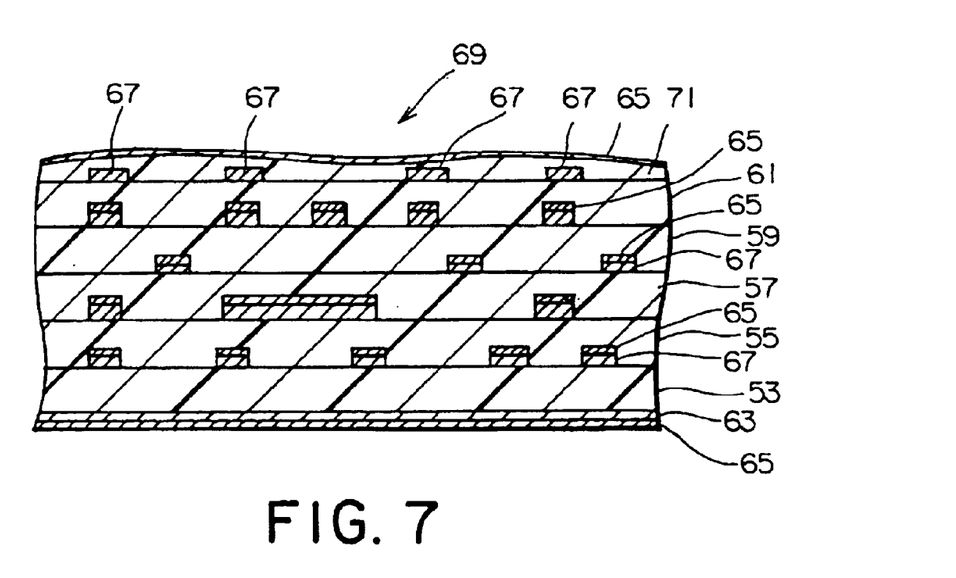
FIG. 7 is a section of a multilayer printed wiring board according to a fourth embodiment of the present invention.

Making reference to FIG. 7, a multi-layer wiring board 69 according to the fourth embodiment of the present invention has first to fifth printed wiring boards 55, 53, 57, 59, and 61, having a polyimide as their base material, formed in laminar fashion. The second printed wiring board 53 deployed below the first printed wiring board 55 comprises a ground pattern 63 on one surface thereof, and a conductor pattern 67 on the other surface thereof. On the ground pattern of the second printed wiring board 53 is formed a granular magnetic thin film 65 across the entire surface thereof. On the conductor pattern on the other surface of the second printed wiring board 53, meanwhile, granular magnetic thin films 65 are formed, and thereupon is stacked one surface side of the first printed wiring board 55. On the other surface side of the first printed wiring board 55 are formed the third and fourth printed wiring boards 57 and 59, each having conductor patterns 67 on one side thereof. On those conductor patterns 67 are formed granular magnetic thin films 65.

On the surface of the fourth printed wiring board 59 on which the conductor patterns 67 are formed is formed the fifth printed wiring board 61. An insulation film 71 is formed so as to cover the entire surface of the surface where the conductor patterns 67 on the outer surface of the fifth printed wiring board 61 are formed, and the granular magnetic thin film 65 is formed so as to cover the entire surface thereon.

In the multi-layer wiring board 69 according to the second embodiment having such a configuration as this, the high-frequency waves emitted from the conductor patterns 67 are absorbed by the granular magnetic thin films 65, and converted to heat, wherefore the emission of high-frequency noise from the multi-layer wiring board to the outside can be suppressed.

This granular magnetic thin film 65 exhibits conductivity and comprises a metal magnetic body, wherefore it can be used directly as a conductor.

The multi-layer wiring board according to the second embodiment, moreover, is configured with the first, third, fourth, and fifth printed wiring boards formed successively on the second printed wiring board 55. However, it goes without saying that multiple printed wiring boards having conductor patterns and using a polyimide as the board may be prepared from the beginning, and those applied similarly using an adhesive such as an epoxy resin or the like.

Next, the granular magnetic body M-X-Y structure based in being used in the embodiments of the present invention and a specific example of a manufacturing method therefor are described next, making reference to FIG. 8.

Figure 8:
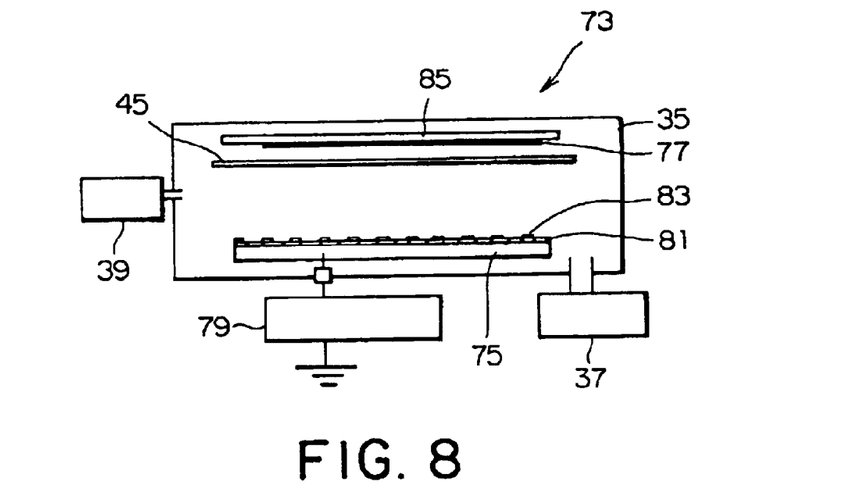
FIG. 8 is a diagram representing a simplified apparatus configuration for forming a granular magnetic thin film.

Referring to FIG. 8, a sputtering apparatus 73 comprises a target sample table platform 75 and board 77 inside a vacuum chamber 35 capable of having the air therein exhausted by a vacuum pump 37. The target sample platform 75 is connected to an RF power supply 79 from the outside. On the target sample platform 75 are a target 81 and a tip 83 placed thereon. Between the target sample platform 75 and the board 77 is deployed a shutter 45 so as to cover the board 77. Symbol 39 designates a gas supply unit for supplying gas to the inside of the chamber, while symbol 85 designates a supporting platform for supporting the board 77.

A manufacturing example is next described.

(Sample 2)

Using the apparatus diagrammed in FIG. 8, a granular magnetic thin film was fabricated on the glass board 77 by sputtering, under the conditions noted below in Table 2. The sputtered film obtained thereby was subjected to a heat treatment in a vacuum magnetic field for 2 hours at 300° C. to yield sample 2. When this sample 2 was subjected to fluoroscopic x-ray analysis, the composition of the film was found to be $Fe_{72}Al_{11}O_{17}$. The film thickness in sample 2 was 2.0 μm, the DC resistivity was 530 μΩ·cm, Hk was 18 Oe (1422 A/m), Ms was 16800 Gauss (1.68 T), and the relative bandwidth bwr was 148%. The value of the ratio between the saturation magnetization of sample 2 and the saturation magnetization of a metal magnetic body consisting solely of the M component was 72.2%.

TABLE 2

| | |
|---|---|
| Vacuum Degree before Deposition | $<1 \times 10^{-6}$ Torr (=$1.33 \times 10^{-4}$ Pa) |
| Atmosphere upon Deposition | Ar |
| Power Supply | RF |
| Target | Fe (φ 100 mm) + $Al_2O_3$ chip (120 pieces) (chip size: 5 mm × 5 mm × 2 mmt) |

In order to verify the magnetic loss characteristics of the sample, the μ-f characteristic was investigated. Measuring the μ-f characteristic is done by inserting the sample into a detection coil fashioned in a rectangular shape, and measuring the impedance while applying a bias magnetic field. Thus the frequency characteristics of the magnetic loss factor μ" are obtained.

(Comparative Sample 2)

Comparative sample 2 was obtained by the same method and under the same conditions as sample 2 except in that the number of $Al_2O_3$ chips was made 90.

When the comparative sample 2 so obtained was subjected to fluoroscopic x-ray analysis, the composition of the film was found to be $Fe_{86}Al_6O_8$. The film thickness was 1.2 μm, the DC resistivity in comparative sample 2 was 74 μΩ·cm, the anisotropic magnetic field was 22 Oe (1738 A/m), and Ms was 18800 Gauss (1.88 T). The ratio between the saturation magnetization of comparative sample 2 and the saturation magnetization of a metal magnetic body consisting solely of the M component, that is, the value of {Ms(M-X-Y)/Ms(M)}×100, was 85.7%.

Figure 9:
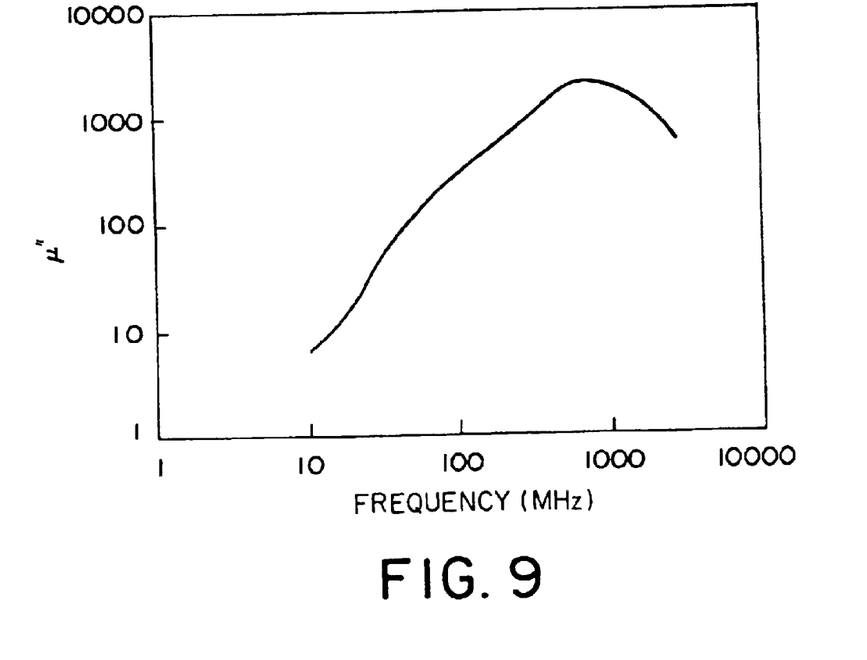
FIG. 9 is a graph representing an example of the frequency dependency of $\mu''$ in a sample 2 according to an embodiment of the present invention.

Referring to FIG. 9, in the μ"-f characteristic of sample 2 of the present invention, the peak is very high, and the dispersion is sharp, with the resonant frequency high in the neighborhood of 700 MHz.

Figure 10:
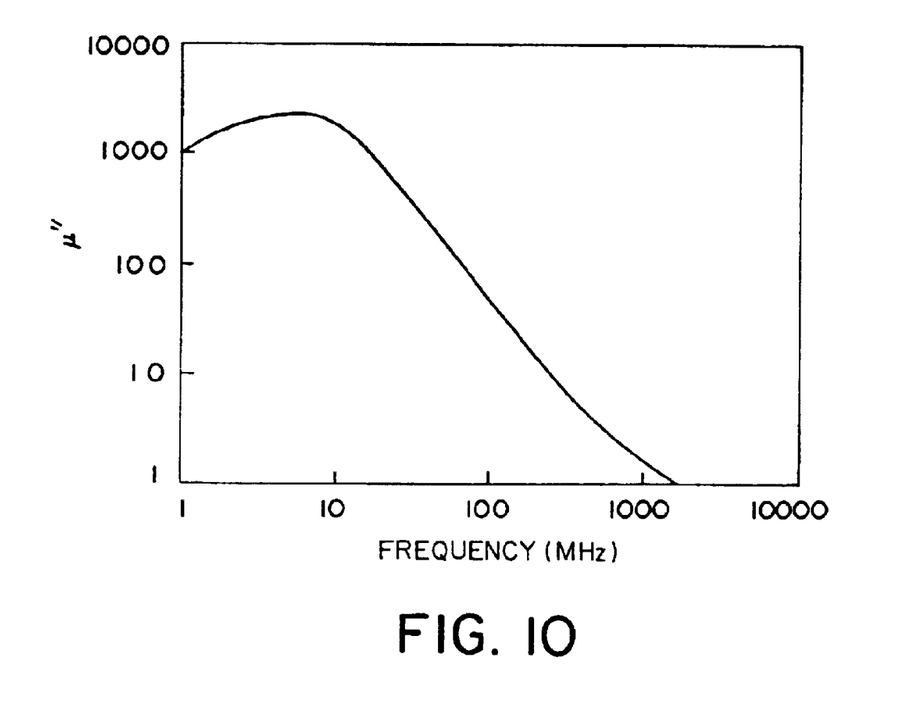
FIG. 10 is a graph representing an example of the frequency dependency of $\mu''$ in a comparative sample 2.

Referring to FIG. 10, in the μ"-f characteristic, comparative sample 2 exhibits a large μ", reflecting the fact that the saturation magnetization Ms is large. However, because the resistance value of comparative sample 2 is low, eddy current losses are generated as the frequency rises. Thus it is evident that a deterioration in the permeability (magnetic loss characteristic) has developed from the low-frequency region, and that the permeability characteristics have become poor at high frequencies.

It will be seen from these results that the magnetic body in sample 2 of the present invention exhibits very high magnetic loss characteristics in high-frequency regions.

Next are described tests done to verify noise suppression effectiveness using samples 1 and 2 obtained with the embodiments of the present invention. These tests were identical for samples 1 and 2, wherefore only the tests for sample 1 are described.

Figure 11:
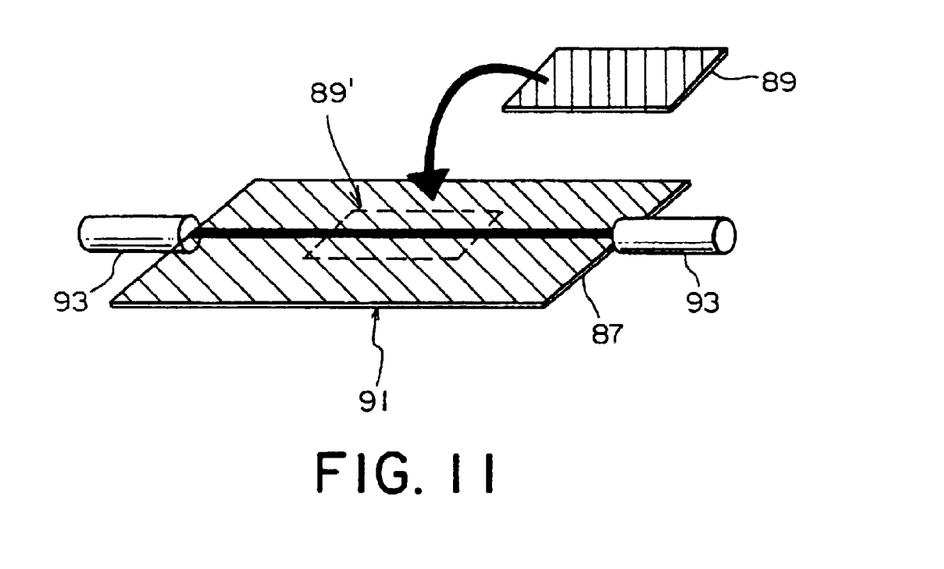
FIG. 11 is a diagonal view of a measurement system for observing the suppression effect of a high-frequency current suppression body comprising a magnetic loss material according to the present invention.

Using the measurement system 91 diagrammed in FIG. 11 to verify noise suppression effectiveness, and using an electromagnetic interference suppressing body comprising sample 1 of a granular magnetic thin film having the permeability characteristic diagrammed in FIG. 5, formed in a square 20 mm on a side, with a film thickness of 2.0 μm, that was placed directly above a microstrip line having a line length of 75 mm and a characteristic impedance of 50 Ω, and the transmission characteristics between 2 Ports were determined using a network analyzer (HP 8753D). Symbol 93 designates a coaxial line connecting the microstrip line and the network analyzer. The results are given in Table 3 below.

TABLE 3

| | Permeability Characteristics | |
|---|---|---|
| | Granular Magnetic Thin Film | Composite Magnetic Sheet |
| $\mu''$/700 MHz | about 1800 | about 3.0 |
| bwr (%) | 148 | 196 |

In Table 3 above, the permeability characteristics for the electromagnetic interference suppression sheet of the granular magnetic thin film sample 1 are given together with the characteristics for a composite magnetic sheet of the same area consisting of flat Sendust powder and a polymer used as a comparative sample. The $\mu''$ of the granular magnetic thin film sample 1 exhibits a dispersion in the sub-microwave band, with a size $\mu''$max=approximately 1800 in the vicinity of 700 MHz. This is some 600 times larger than the $\mu''$ of the comparative sample that exhibits $\mu''$ dispersion in the same band. Furthermore, the relative bandwidth bwr is small as compared with that of the comparative sample. When high-frequency currents are suppressed by deploying a magnetic loss material immediately next to a noise transmission path and imparting an equivalent resistance component to the transmission path, it is believed that the level of suppression effect will be roughly proportional to the product of the size of $\mu''$ and the thickness of the magnetic body ($\mu'' \cdot \delta$), wherefore, when comparing suppression effects, a composite magnetic sheet wherein $\delta$=1.0 mm at $\mu'' \approx 3$ such that the value of $\mu'' \cdot \delta$ will be on the same order was used as the comparative example.

Figure 12A:
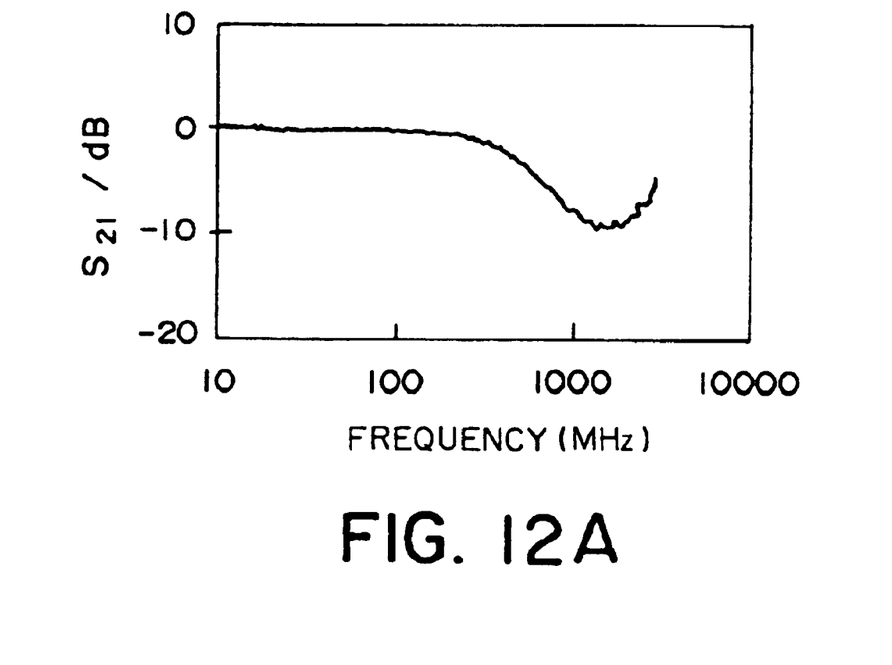
FIG. 12A is a graph of the transmission characteristic (S21) of sample 1 according to an embodiment of the present invention.
Figure 12B:
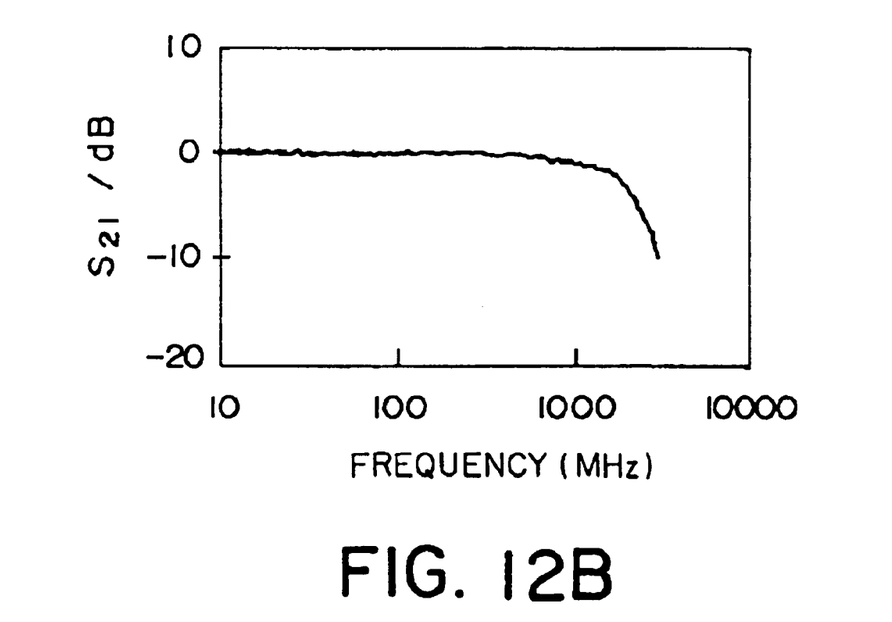
FIG. 12B is a graph of the transmission characteristic (S21) of a composite magnetic sheet that is a comparative sample 1.
Figure 13:
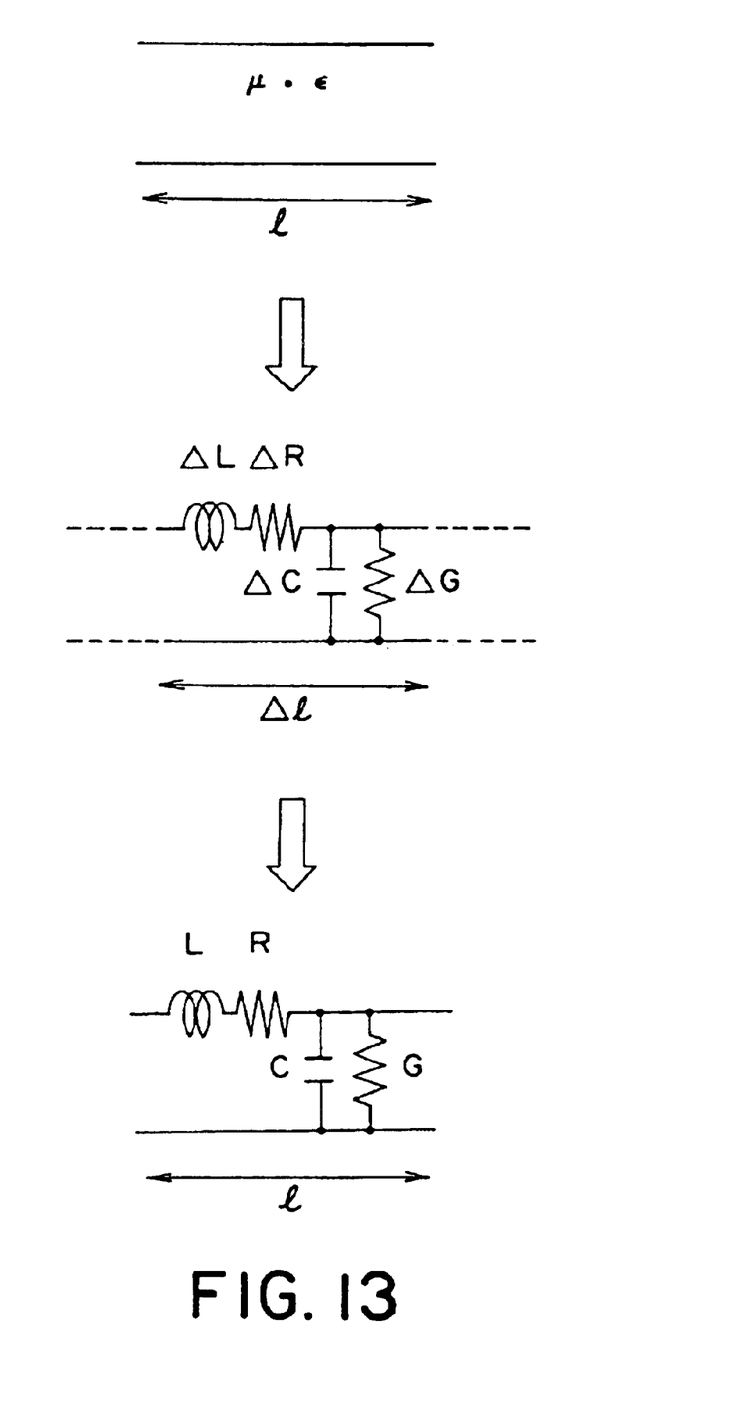
FIG. 13 is a diagram of an equivalent circuit of a magnetic body according to an embodiment of the present invention.
Figure 14A:
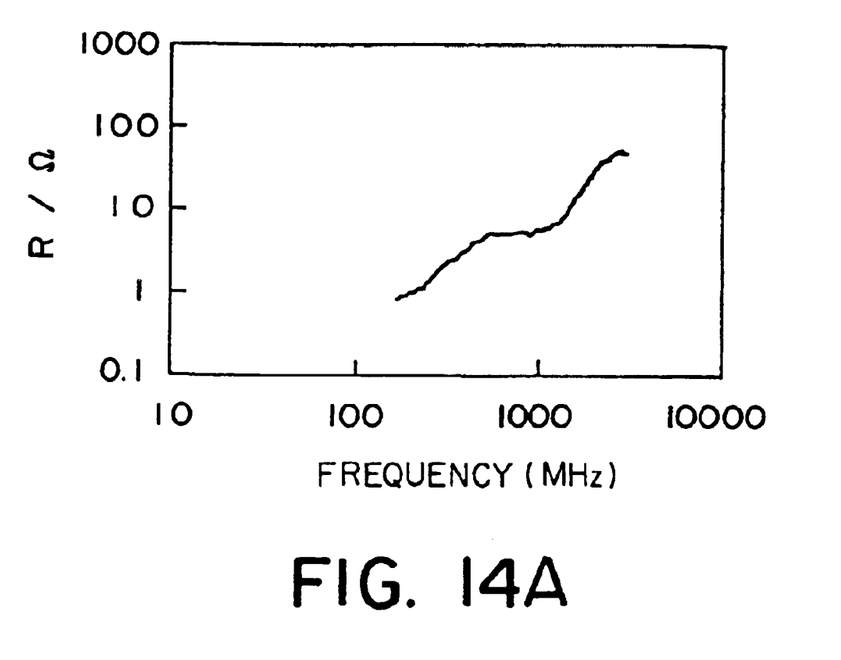
FIG. 14A is a graph of the R value calculated from the transmission characteristic of the sample 1, according to an embodiment of the present invention.
Figure 14B:
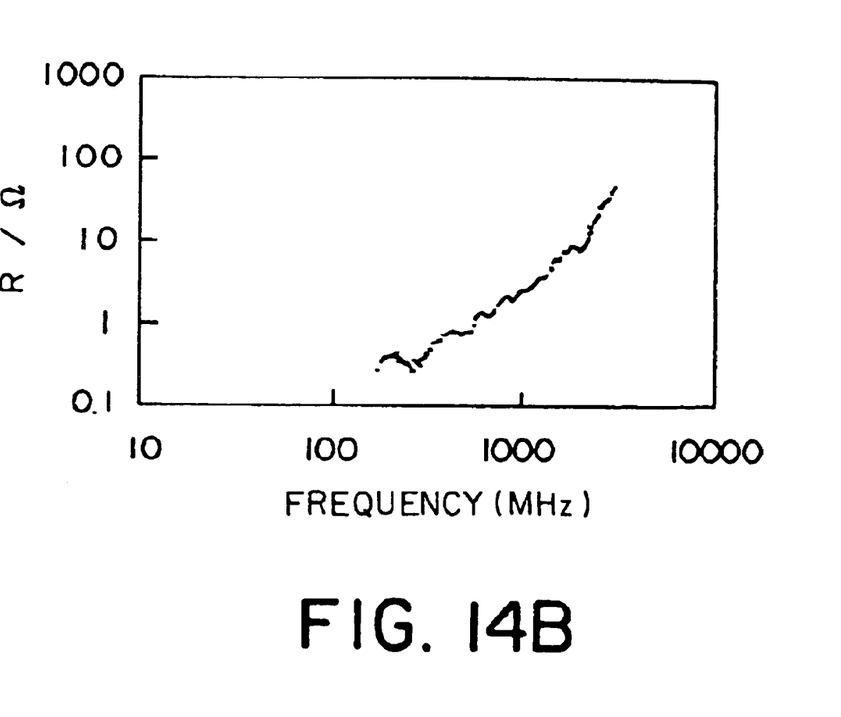
FIG. 14B is a graph of the R value calculated from the transmission characteristic of a composite magnetic sheet that is a comparative sample.

More specifically, as diagrammed in FIG. 11, an electromagnetic interference suppression body sheet 89 was deployed directly over a microstrip line 87 as indicated by the dotted line 89', and the changes in the transmission characteristic $S_{21}$ was determined. In FIGS. 12A and 12B, the $S_{21}$ characteristics are plotted when deploying, respectively, the electromagnetic interference suppression body sheet of the granular magnetic thin film sample 1 and the composite magnetic sheet. With the deployment of the granular magnetic thin film sample 1, the $S_{21}$ characteristic decreases at and above 100 MHz, then increases after exhibiting an extremely small value of −10 dB near 2 GHz. In the case of the composite magnetic sheet, on the other hand, the $S_{21}$ characteristic simply decreases from several hundreds of MHz on, exhibiting approximately −10 dB at 3 GHz. These results indicate both that the $S_{21}$ transmission characteristic is dependent on the $\mu''$ dispersion of the magnetic body, and that the level of the suppression effect is dependent on the $\mu'' \cdot \delta$ product. Thereupon, the magnetic body was assumed to be a dimension λ distribution constant line such as diagrammed in FIG. 13, and, after finding the equivalent circuit constant per unit length (Δλ) from the transmission characteristics $S_{11}$ and $S_{21}$, the equivalent circuit constant converted to the sample dimension (λ) was calculated. When a magnetic body is placed above a microstrip line, as in this study, because the changes in transmission characteristic are mainly due to the equivalent resistance component that is added in series, the equivalent resistance R was found, and the frequency dependency thereof was investigated. In FIGS. 14A and 14B, the frequency variation in the equivalent resistance R in the present invention and in the composite magnetic sheet that is the comparative sample are plotted. In both cases, the equivalent resistance R simply increases in the sub-microwave band, becoming several tens of Ω at 3 GHz. The frequency dependency of the equivalent resistance R appears to have a different trend from that of the frequency dispersion of $\mu''$ that becomes extremely large in the vicinity of 1 GHz, in both cases, but this is thought to be a result of reflecting the fact that, in addition to the $\mu'' \cdot \delta$ product noted earlier, the ratio of the sample dimensions to the wavelength increases simply.

In the embodiments of the present invention, manufacturing examples are indicated that are based on sputtering or vacuum vapor deposition procedures, but such manufacturing methods as ion beam vapor deposition or gas deposition may also be used, and there is no limit on the method so long as it is one wherewith the magnetic loss material of the present invention can be uniformly effected.

In the embodiments of the present invention, moreover, it is an as-deposition film, but the performance and characteristics can be enhanced after film fabrication by performing a heat treatment in a vacuum magnetic field.

Based on the foregoing, it is evident that the samples of the present invention that exhibit $\mu''$ dispersion in the sub-microwave band exhibit a high-frequency current suppression effect equivalent to that of a composite magnetic sheet having a thickness that is approximately 500 times greater, and that such are promising as materials used to minimize EMI, between electronic components comprising semiconductor integrated devices and the like that operate with a high-speed clock running near 1 GHz and electronic components mutually susceptible to interference, and in electronic components and circuit devices and the like that use high frequencies.

The granular magnetic films described in the foregoing relate only to $Fe_{86}Al_6O_8$, but it is evident that the granular magnetic thin film of the present invention can elicit the same effects even if, instead thereof, the components of the magnetic body with the general formula M-X-Y are such that M is Ni, Fe, or Co, the X component is C, B, Si, Al, Mg, Ti, Zn, Hf, Sr, Nb, Ta, or a rare earth, or, alternatively, a mixture of those, and the Y component is F, N, or O, or, alternatively, a mixture of those.

The film forming method used in the embodiments described in the foregoing was sputtering, but other methods such as vapor deposition or the like can also be employed. In addition, such manufacturing methods as ion beam deposition or gas deposition may also be used. There is no limitation on the method so long as it is one wherewith the granular magnetic thin film of the present invention can be realized uniformly.

Based on the present invention, as described in the foregoing, wiring boards can be provided that have magnetic thin films which exhibit outstanding high-frequency magnetic loss characteristics that are extremely useful in eliminating interference caused by spurious electromagnetic emissions or electromagnetic noise in flexible wiring boards that use high frequencies.

Based on the present invention, furthermore, unilayer or multilayer wiring boards can be provided that have magnetic thin films which exhibit outstanding high-frequency magnetic loss characteristics that are extremely useful in eliminating interference caused by spurious electromagnetic emissions or electromagnetic noise in unilayer or multilayer wiring boards that use high frequencies.

What is claimed is:

1. A wiring board, comprising:
a board of at least one layer comprising a conductor part and a ground part, said conductor part comprising signal line conductor patterns,
said ground part comprising
a ground pattern or
a ground surface deployed over the entirety of one surface of said board;
at least a portion of said conductor part being formed by an electrically conductive magnetic thin film; and
a thin film magnetic loss material deployed on part of said board or on said conductor part.

2. The wiring board according to claim 1, wherein said magnetic thin film is formed on said signal line conductor patterns.

3. The wiring board according to claim 1, wherein said magnetic thin films are formed so as to be separated from signal line conductor patterns in portion where said signal line conductor patterns are not formed.

4. The wiring board according to claim 1, wherein said magnetic thin film is deployed with an insulation layer interposed therebetween so as to cover said conductor patterns.

5. The wiring board according to claim 1, wherein said magnetic thin film is fabricated by at least one method of sputtering and vapor deposition.

6. The wiring board according to claim 1, wherein said magnetic thin film has a thickness within a range of 0.3 $\mu$m to 2 $\mu$m.

7. The wiring board according to claim 1, wherein said wiring board is a multilayer printed wiring board comprising a structure of at least 3 layers.

8. The wiring board according to claim 1, wherein said conductor part is formed of an electrically conductive magnetic thin film.

9. The wiring board according to claim 1, wherein said magnetic thin film is configured of a magnetic loss material represented by M-X-Y, where M is at least one of Fe, Co, and Ni, Y is at least one of F, N, and O, and X is at least one element other than M or Y, said magnetic loss material is a broad-band magnetic loss material in which maximum value $\mu''_{max}$ of loss factor $\mu''$ that is imaginary component in complex permeability of said magnetic loss material exists within a frequency range of 100 MHz to 10 GHz, and a relative bandwidth bwr is not smaller than 150% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof.

10. The wiring board according to claim 9, wherein size of saturation magnetization in said magnetic loss material is within a range of 60% to 35% of saturation magnetization of a metal magnetic body consisting solely of M component.

11. The wiring board according to claim 9, wherein said magnetic loss material exhibits a DC electrical resistivity having a value larger than 500 $\mu\Omega$·cm.

12. The wiring board according to claim 1, wherein said magnetic thin film is configured of a magnetic loss material having a composition represented by M-X-Y, where M is at least one of Fe, Co, and Ni, Y is at least one of F, N, and O, and X is at least one element other than M or Y, said magnetic loss material is a narrow-band magnetic loss material in which maximum value $\mu''_{max}$ of loss factor $\mu''$ that is imaginary component in complex permeability of said magnetic loss material exists within a frequency range of 100 MHz to 10 GHz, and a relative bandwidth bwr is not greater than 200% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof.

13. The wiring board according to claim 12, wherein size of saturation magnetization in said magnetic loss material is within a range of 80% to 60% of saturation magnetization of a metal magnetic body consisting solely of M component.

14. The wiring board according to claim 12, wherein said magnetic loss material exhibits a DC electrical resistivity that is within a range of 100 $\mu\Omega$·cm to 700 $\mu\Omega$·cm.

15. The wiring board according to claim 12, wherein X component of said magnetic thin film is at least one of C, B, Si, Al, Mg, Ti, Zn, Hf, Sr, Nb, Ta, and rare earth elements.

16. The wiring board according to claim 12, wherein, in said magnetic loss material, said M exists in a granular form dispersed in matrix of said X-Y compound.

17. The wiring board according to claim 16, wherein mean particle diameter of particles M having said granular form is within range of 1 nm to 40 nm.

18. The wiring board according to claim 12, wherein said magnetic loss material exhibits an anisotropic magnetic field Hk of 600 Oe (5.34×10$^4$ A/m) or less.

19. The wiring board according to claim 12, wherein said magnetic loss material is selected from Fe$_\alpha$—Al$_\beta$—O$_\gamma$ and Fe$_\alpha$—Si$_\beta$—O$_\gamma$.

* * * * *